(12) United States Patent
Abe et al.

(10) Patent No.: US 8,270,922 B2
(45) Date of Patent: *Sep. 18, 2012

(54) RADIO WAVE RECEIVER

(75) Inventors: Kazuaki Abe, Iruma (JP); Hideo Abe, Tokorozawa (JP)

(73) Assignee: Casio Computer Co., Ltd., Tokyo (JP)

( * ) Notice: Subject to any disclaimer, the term of this patent is extended or adjusted under 35 U.S.C. 154(b) by 221 days.

This patent is subject to a terminal disclaimer.

(21) Appl. No.: 12/777,400

(22) Filed: May 11, 2010

(65) Prior Publication Data

US 2010/0311370 A1    Dec. 9, 2010

(30) Foreign Application Priority Data

Jun. 3, 2009  (JP) .................. 2009-133686

(51) Int. Cl.
*H04B 1/18* (2006.01)
(52) U.S. Cl. ............. 455/193.1; 455/179.1; 455/188.1
(58) Field of Classification Search ............. 455/150.1, 455/179.1, 188.1, 192.1, 193.1, 255
See application file for complete search history.

(56) References Cited

U.S. PATENT DOCUMENTS

| | | | |
|---|---|---|---|
| 6,070,803 A | 6/2000 | Stobbe | |
| 6,317,027 B1 | 11/2001 | Watkins | |
| 6,907,234 B2 * | 6/2005 | Karr et al. ................ | 455/193.1 |
| 7,299,018 B2 | 11/2007 | Van Rumpt | |
| 7,583,942 B2 | 9/2009 | Ihara | |
| 7,756,496 B2 | 7/2010 | Takei | |
| 8,073,412 B2 | 12/2011 | Jaisimha et al. | |
| 2006/0109835 A1 | 5/2006 | Saitoh | |
| 2010/0311371 A1 | 12/2010 | Abe et al. | |

FOREIGN PATENT DOCUMENTS

| | | |
|---|---|---|
| AU | 2008101062 A4 | 11/2008 |
| JP | 1-045248 B | 10/1989 |
| JP | 11-312958 A | 11/1999 |

(Continued)

OTHER PUBLICATIONS

Japanese Office Action dated May 10, 2011 (and English translation thereof) in counterpart Japanese Application No. 2009-133686.

(Continued)

*Primary Examiner* — Quochien B Vuong
(74) *Attorney, Agent, or Firm* — Holtz, Holtz, Goodman & Chick, PC (57) ABSTRACT

Disclosed is a radio wave receiver including an antenna to receive a radio wave, a tuning unit to switch a frequency characteristic of the antenna in a stepwise fashion, an oscillation unit to oscillate the antenna and a circuit section of the tuning unit, a receiving process unit to carry out a signal process by extracting a signal of a desired wave among received signals which are received from the antenna, a search control unit in which the oscillation unit is made to generate an oscillation signal at the circuit section and in which the oscillation signal searches a setting condition of the tuning unit which is extracted in the receiving process unit by switching a setting of the tuning unit and a search range deciding unit to selectively decide an adjustable range in which the switching of the setting of the tuning unit is carried out by the search control unit so as to be a specific adjustable range which is a portion of an entire adjustable range of the tuning unit corresponding to a frequency of the desired wave.

6 Claims, 8 Drawing Sheets

FOREIGN PATENT DOCUMENTS

| | | |
|---|---|---|
| JP | 2000-231609 A | 8/2000 |
| JP | 2004-505485 A | 2/2004 |
| JP | 2006-177927 A | 7/2006 |
| JP | 2006-246419 A | 9/2006 |
| JP | 2007-288326 A | 11/2007 |
| WO | WO 00/42585 A1 | 7/2000 |
| WO | WO 2004/105240 A1 | 12/2004 |

OTHER PUBLICATIONS

English Search and Examination Report dated Sep. 24, 2010 (in English) in counterpart English Application No. GB 1009059.5.

U.K. Office Action dated Aug. 4, 2011 (in English) issued in U.K. Application No. GB 1009059.5.

U.S. Appl. No. 12/775,624, filed May 7, 2010; Title: "Radio Wave Receiver"; First Named Inventor: Kazuaki Abe.

* cited by examiner

FIG. 2

| CAPACITANCE NUMBER | C9 | C8 | C7 | C6 | C5 | C4 | C3 | C2 | C1 | C0 |
|---|---|---|---|---|---|---|---|---|---|---|
| CAPACITY [pF] | 50 | 218 =1.7*2$^7$ | 109 =1.7*2$^6$ | 54 =1.7*2$^5$ | 27 =1.7*2$^4$ | 14 =1.7*2$^3$ | 6.8 =1.7*2$^2$ | 3.4 =1.7*2$^1$ | 1.7 =1.7*2$^0$ | 0.85 =1.7/2 |

| FREQUENCY OF SET CHANNEL [kHz] | SEARCH RANGE OF CAPACITY [pF] | RANGE OF COUNTER VALUE (DECIMAL NUMBER) | SWITCH CONDITION (C8C7C6C5C4C3C2C1) |
|---|---|---|---|
| 40 | 262.5~391.7 | 125~201 | (01111101)~(11001001) |
| 60 | 116.3~174.1 | 39~73 | (00100111)~(01001001) |
| 77.5 | 70.4~104.4 | 12~32 | (00001100)~(0010000) |

FIG. 7

| RESONANCE FREQUENCY [kHz] | CAPACITY OF TUNING [pF] | SWITCH CONDITION OF C0 BEING FIXED (C8C7C6C5C4C3C2C1) | SWITCH CONDITION OF C0 BEING SWITCHED (C8C7C6C5C4C3C2C1C0) |
|---|---|---|---|
| 78.5 | 82.3 | (00010011) | (000100110) |
| 78.1 | 83.15 | — | (000100111) |
| 77.7 | 84.0 | (00010100) | (000101000) |
| 77.3 | 84.85 | — | (000101001) |
| 76.9 | 85.7 | (00010101) | (000101010) |

FIG. 8

RADIO WAVE RECEIVER

BACKGROUND OF THE INVENTION

1. Field of the Invention

The present invention relates to a radio wave receiver comprising an antenna and a tuning unit.

2. Description of Related Art

Conventionally, there is suggested a communication apparatus which makes the resonance frequency of an antenna tune to the frequency of a desired wave by changing frequency characteristic of a tuning circuit connected to the antenna (for example, Japanese Patent Application Laid-Open Publication No. 11-312958 and Japanese Patent Application Laid-Open Publication No. 2000-231609). Further, Japanese Patent Application Laid-Open Publication No. 11-312958 discloses a technique in which the size of tuning capacitance can be switched continuously and finely by carrying out weighting to the capacitance values of a plurality of resonance condensers which can be connected and can be cut-off in an antenna circuit to arbitrarily switch the resonance condensers.

When the adjustment of tuning capacitance can be finely set, a long time is required to search for the optimum setting condition by carrying out switching of the tuning capacitance one step at a time for the entire adjustable range because the number of steps to switch the setting increases.

An object of the present invention is to provide a radio wave receiver which can shorten the process time by effectively carrying out the switching of the setting of the tuning circuit when searching for the optimum setting condition of the tuning circuit.

SUMMARY OF THE INVENTION

One of preferable embodiments of the present invention is a radio wave receiver comprising an antenna to receive a radio wave, a tuning unit to switch a frequency characteristic of the antenna in a stepwise fashion, an oscillation unit to oscillate the antenna and a circuit section of the tuning unit, a receiving process unit to carry out a signal process by extracting a signal of a desired wave among received signals which are received from the antenna, a search control unit in which the oscillation unit is made to generate an oscillation signal at the circuit section and in which the oscillation signal searches a setting condition of the tuning unit which is extracted in the receiving process unit by switching a setting of the tuning unit and a search range deciding unit to selectively decide an adjustable range in which the switching of the setting of the tuning unit is carried out by the search control unit so as to be a specific adjustable range which is a portion of an entire adjustable range of the tuning unit corresponding to a frequency of the desired wave.

DESCRIPTION OF THE PREFERRED EMBODIMENTS

Hereinafter, an embodiment of the present invention will be described based on the drawings.

Figure 1:
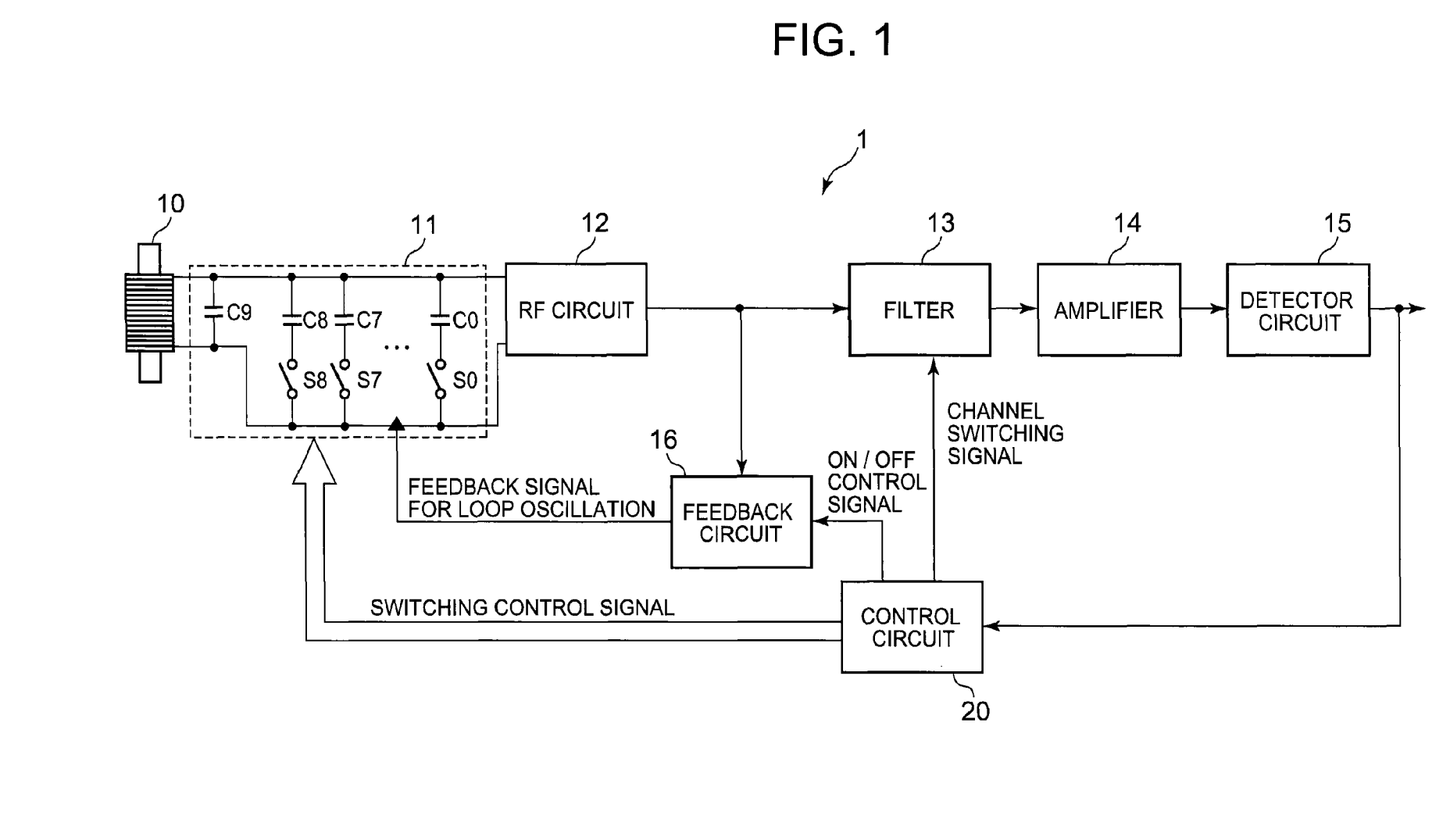
FIG. 1 is a block diagram showing an entire radio wave receiver of an embodiment of the present invention.

FIG. 1 is a block diagram showing an entire radio wave receiver of the embodiment of the present invention.

The radio wave receiver 1 of this embodiment is a device to receive a radio wave and to carry out a demodulation process of an information signal included in a signal of a desired wave. In particular, the radio wave receiver 1 is a device to receive a standard radio wave in which time code is included, which is installed in an electronic watch. The radio wave receiver 1 comprises an antenna 10 to receive a radio wave, a tuning circuit (tuning unit) 11 to adjust frequency characteristic of the antenna 10, a RF circuit 12 to carry out amplification and noise removal of the RF signal received by the antenna 10, a filter 13 to extract the frequency signal of the desired wave from the received signal, an amplifier 14 to amplify the extracted frequency signal of the desired wave, a detector circuit 15 to detect an output of the amplifier 14 and regenerate the information signal, a feedback circuit 16 as an oscillation unit which can cause a loop oscillation at the antenna 10 and at the circuit section of the tuning circuit 11 by feeding back the RF signal, a control circuit (search control unit) 20 to execute an adjustment process and the like of the antenna 10 and the like.

Among the above structures, a receiving process unit to extract the signal of the desired wave to carry out a signal processing is structured by the filter 13, the amplifier 14 and the detector circuit 15.

The antenna 10 is a bar antenna which is formed by a coil being wrapped around a core, for example, and alternatively, a monopole antenna, a dipole antenna or the like can be applied according to the frequency to be received. The band characteristic of signals which can be received by the antenna 10 has a characteristic where the receiving level reaches the peak with the resonance frequency of the coupled circuit which is formed by the inductance component of the antenna 10 and the capacitance component of the tuning circuit 11 joining with each other and the receiving level decreases as the frequency deviates from the resonance frequency.

The tuning circuit 11 comprises a capacitative element C9 which is fixedly connected between both of the terminals of the antenna 10, a plurality of capacitative elements C0 to C8 which can be connected in parallel between both of the terminals of the antenna 10 and which can cut-off the connection and a plurality of switches S0 to S8 to switch connect/cut-off of the capacitative elements C0 to C8, for example. By controlling ON and OFF by arbitrarily combining the switches S0 to S8, the capacitance value of the tuning circuit 11 changes and the resonance frequency of the resonance circuit which is joined with the inductance component of the antenna 10 can be adjusted.

The RF circuit 12 is a circuit which includes a RF amplifier which amplifies the received signal which is received via the antenna 10, a filter for noise removal and the like.

The filter 13 allows a signal of the frequency of the desired wave among the signals received via the antenna 10 pass through and makes the signals of other frequency attenuate. The filter 13 is structured by a bandpass filter, a lowpass filter or the like being connected in cascade connection. The passing band of the filter 13 is structured with a very narrow band width, for example, about 10 Hz, centering the frequency of the desired wave. The filter 13 is structured so as to be able to switch the center frequency of the pass band between the frequencies of a plurality of receiving channels (for example, 40 kHz, 60 kHz, 77.5 kHz) based on the channel switching signal of the control circuit 20.

The feedback circuit 16 has an amplifier built-in, for example, and causes oscillating movement at the feedback loop by amplifying the output of the RF circuit 12 by the amplifier and by feeding the amplified output of the RF circuit 12 back to the signal line of the tuning circuit 11. The feedback circuit 16 is connected to the signal line via the coupling condenser about a size which does not influence the frequency characteristic of the antenna 10 and the tuning circuit 11, and the oscillation frequency of the feedback loop is about the same as the resonance frequency of the antenna 10 (the resonance frequency of the resonance circuit in which the antenna 10 and the tuning circuit 11 are joined). Further, the feedback circuit 16 can be switched between operation state and non-operation state by turning on and turning off the supply of power voltage by a switch, for example.

Here, the structure of the feedback circuit 16 can be modified variously. For example, regarding where the signal is to be fed back via the feedback circuit 16, it can be structured so that the signal is to be fed back to the signal line wrapped around the antenna 10, for example, as an alternative to the signal line of the tuning circuit 11. Further, the output of the RF circuit 12 may be differential signals and the differential signals may be respectively fed back to each of a pair of signal lines of the antenna 10 or the tuning circuit 11. Furthermore, an auxiliary winding which is electromagnetically coupled with the coil of the antenna 10 may be provided and the signal may be fed back to the auxiliary winding, or an antenna for radiation may be provided and the signal may be fed back to the antenna 10 as a radio wave. Moreover, it is possible to feedback the output of the RF circuit 12 directly to the signal line of the antenna 10 or the tuning circuit 11 via the signal line for feedback without amplifying the signal at the feedback circuit 16. In such case, by providing a switch element serially with the signal line for feedback and by turning this switch element on and off, it is possible to control ON/OFF of the feedback operation.

The control circuit 20 has an AD converter, a CPU (Computer Peripheral Unit), a ROM (Read Only Memory) in which control data and control program are stored, a RAM (Random Access Memory) which provides the CPU with a memory space for working, a 9-bit counter to decide conditions of the switches S0 to S8 of the tuning circuit 11, an I/O circuit to output a control signal outside and the like built-in. The AD converter carries out AD conversion to the signal which is inputted to the input terminal ADC and outputs the digital value thereof so as to be readable by the CPU. The I/O circuit outputs switching control signal of the switches S0 to S8 according to the counter value of the 9-bit counter, outputs the ON/OFF control signal to the feedback circuit 16 and outputs the channel switching signal to the filter 13 by a command of the CPU.

In the ROM of the control circuit 20, a processing program of a radio wave receiving process to receive the standard radio wave and to decipher the time code, a processing program of an automatic adjustment process of antenna to store the optimum setting condition of the tuning circuit 11 by carrying out a setting adjustment of the tuning circuit 11 for each of the receiving channels and the like are stored.

Figure 2:
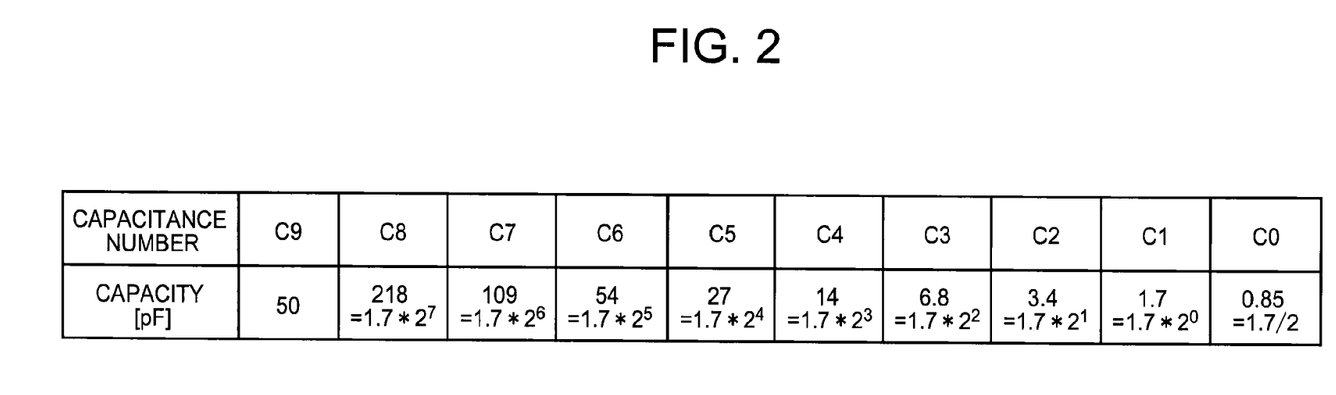
FIG. 2 is a table showing an example of capacitance values of a plurality of capacitative elements which are provided in a tuning circuit.

In FIG. 2, a table showing an example of capacitance value of each of the capacitative elements which are provided in the tuning circuit 11 is shown.

Regarding each of the capacitative elements C0 to C9 of the tuning circuit 11, nine capacitative elements C0 to C8 which can be switched between connect and cut-off, excluding the capacitative element C9 which is fixedly connected, are designed so as to be increased approximately by power-of-two in order from the small capacitance value. For example, capacitance values shown in the table of FIG. 2 are set. Further, nine switches S0 to S8 for respectively switching connection of the capacitative elements C0 to C8 are made to correspond so as to be switched according to each of the bit values of the 9-bit counter provided in the control circuit 20. Each of the bits of the counter is made to correspond respectively to the values from the small capacitance value to the large capacitance value in order of high order bit to lower order bit.

By the capacitance value of each of the capacitative elements C0 to C8 as described above and by the structure of the 9-bit counter which decides the connection condition of the capacitative elements, the total capacitance value of the tuning circuit 11 which is coupled with the antenna 10 can be switched approximately in proportion to the counter value of the counter. For example, when it is structures so that the capacitance values of the capacitative elements C0 to C8 are increased precisely by power-of-two, the total capacitance value of the tuning circuit 11 which is coupled with the antenna 10 can be switched almost consecutively by an interval of minimum switching steps (for example, 0.85 pF) from the minimum capacitance value (for example, 50 pF) when all of the capacitative elements C0 to C8 are cut-off to the maximum capacitance value (for example, 484 pF) when all of the capacitative elements of C0 to C8 are connected.

Figure 3:
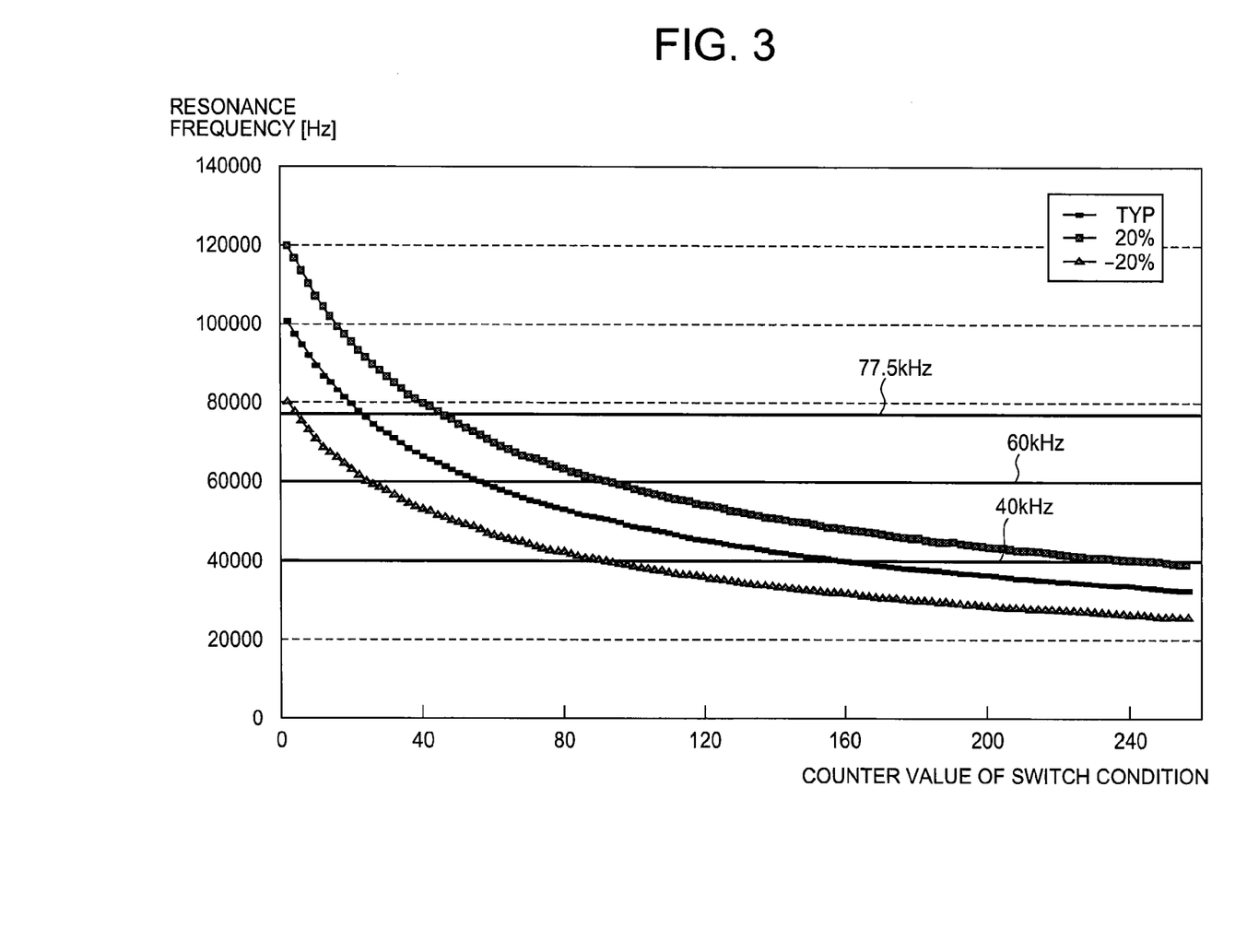
FIG. 3 is a graph showing relation between counter values which decide switching condition of the tuning circuit and resonance frequency of the antenna.

In FIG. 3, a graph which expresses relation between counter value that decides switching condition of the tuning circuit 11 and resonance frequency of the antenna is shown. In FIG. 3, the plot line which is the black horizontal line is the characteristic line when the capacitative elements C0 to C9 have ideal capacitance values, the square plot line is the characteristic line when the capacitance values of the capacitative elements C0 to C9 have an error of +20% and the triangle plot line is the characteristic line when the capacitance values of the capacitative elements C0 to C9 have an error of −20%. Further, the vertical axis of the graph of FIG. 3 indicates frequency (Hz) and the horizontal axis indicates counter value (decimal notation) which decides the switching condition of the switches S0 to S8. Here, in the embodiment, the signal value of the switch C0 which corresponds to the minimum capacitative element C0 is a value of first decimal point in binary notation, and the 8-bit signal value of the switches S8 to S1 is expressed in decimal notation as a value before decimal point.

As shown in FIG. 3, by the above described structure of the tuning circuit 11, the resonance frequency of the antenna 10 is to change gently according to the counter value which decides the switching condition of the switches S0 to S8.

A constant (for example, about ±10%) product tolerance occurs in the capacitance values of the capacitative elements C0 to C9 and the inductance value of the antenna 10. However, when the plurality of capacitance elements C0 to C8 are formed on 1-chip semiconductor, error of each of the capacitative elements C0 to C8 will occur at a similar rate. Therefore, as shown in the square plot line and the triangle plot line of FIG. 3, the characteristic line of the resonance frequency of the antenna 10 changes its value so as to swing up and down as a whole with respect to the standard characteristic line according to the error of the capacitative elements C0 to C8. However, the characteristic of changing gently according to the counter value which decides the switching conditions of the switches S0 to S8 does not change.

Thus, as shown in FIG. 3, by arbitrarily selecting the capacitance value of each of the capacitative elements C0 to C9 of the tuning circuit 11 according to the inductance value of the antenna 10, the resonance frequency of the antenna 10 can be adjusted so as to suite each of the received frequencies of the plurality of channels (for example, 40 kHz, 60 kHz, 77.5 kHz) by arbitrarily carrying out switching between connect/cut-off of the capacitative elements C0 to C8 even when error occurs in the inductance value and the capacitance values.

Further, the resonance frequency of the antenna 10 is proportionate to the reciprocal of square root of the capacitance value. Therefore, as shown in FIG. 3, when the total capacitance value which is to be switched to the connected condition in the tuning circuit 11 changes at a constant step, the amount of change in step of the resonance frequency of the antenna 10 is not constant and will be different according to the frequency band. For example, in a range of high frequency, the amount of change in step of the frequency is large with respect to change in the capacitance value at a constant step. In contrary, in a range of low frequency, the amount of change in step of the frequency is small with respect to the change in the capacitance value at a constant step.

[Antenna Adjustment Process]

First, an outline of the antenna adjustment process will be described. The antenna adjustment process is a process to search the setting condition of the tuning circuit 11 which tunes the resonance frequency of the antenna 10 to the frequency of the desired wave.

In the antenna adjustment process, the feedback circuit 16 is constantly in operation state during the process. When the feedback circuit 16 is in operation state, an oscillation loop is formed in a signal path of the RF circuit 12, the feedback circuit 16 and the tuning circuit 11 and an oscillation signal is generated at this section. In the oscillation loop, the circuit constant which becomes dominant to decide the oscillation frequency is the inductance of the antenna 10 and the capacitance component of the tuning circuit 11. Therefore, the frequency of the oscillation signal will be approximately same as the resonance frequency of the coupled circuit of the antenna 10 and the tuning circuit 11.

Further, in the antenna adjustment process, the CPU switches the switches S0 to S8 of the tuning circuit 11 to switch the total capacitance value which is to be switched to the connected state in the tuning circuit 11 within a predetermined adjustable range while the oscillation signal is being generated. By this switching, the resonance frequency of the antenna 10 and the frequency of the oscillation signal are also changed. Further, every time the frequency of the oscillation signal is switched, AD conversion is carried out to the output level of the detector circuit 15 and the output level is detected. The operation where the setting of the tuning circuit 11 is switched while monitoring the detector output level is called the search process.

Here, when the resonance frequency of the antenna 10 is deviated from the frequency of the desired wave by the switching of the setting of the tuning circuit 11, the oscillation signal having a frequency approximately equal to the resonance frequency is greatly attenuated by the filter 13. Therefore, the level of detector output becomes small. On the other hand, when the resonance frequency of the antenna 10 approximately overlaps the frequency of the desired wave by the switching of the setting of the tuning circuit 11, the oscillation signal having a frequency approximately equal to the resonance frequency passes through the filter 13 and the level of detector output increases.

Thus, by the above search process, the CPU can obtain the setting condition of the tuning circuit 11 in which the level of detector output is at peak as the optimum setting condition to tune the resonance frequency of the antenna 10 to the frequency of the desired wave. Further, by carrying out the above search process to each of the plurality of receiving channels, the optimum setting condition of the tuning circuit which corresponds to each of the receiving channels can be obtained.

Moreover, in the antenna adjustment process of the embodiment, the adjustable range in which the setting of the tuning circuit 11 is to be switched in the search process is to be narrowed down to a specific adjustable range (called search range) which is set to a portion within the entire adjustable range by making the adjustable range correspond to the frequency of the desired wave of the receiving channel.

Figure 4:
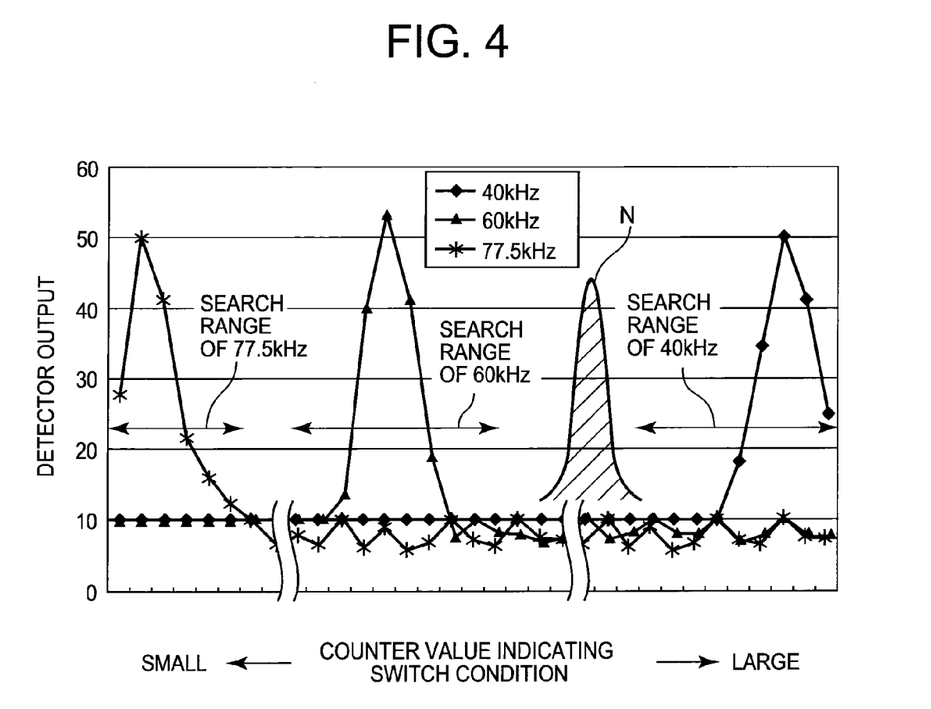
FIG. 4 is a graph conceptually expressing an example of search ranges in the antenna adjustment process corresponding to each of the receiving channels.

In FIG. 4, a graph expressing an example of the search range of the antenna adjustment process which corresponds to each of the receiving channels is shown. In this graph, each pattern of detector output of a plurality of the receiving channels are conceptually shown, and the numerical values shown by the graph lines and the change patters are not the actual values and patterns.

As shown in FIG. 3, the tuning circuit 11 is structured to have a broad adjustable range so that the resonance frequency of the antenna 10 can be tuned to all of the frequencies of a plurality of receiving channels. Therefore, when merely tuning the resonance frequency of the antennal 10 to the frequency of a receiving channel (for example, 77.5 kHz), there is no need to switch the setting within the entire adjustable range, and as shown in FIG. 4, the optimum setting condition of the tuning circuit 11 corresponding to the receiving channel can be obtained even when the search range is narrowed down to a range around the adjusting point corresponding to the receiving channel. Therefore, in the antenna adjustment process of the embodiment, search process within an unneeded adjustable range is omitted to shorten the process time by narrowing down the search range so as to be corresponded to the receiving channel. Particular examples of each search range respectively corresponding to each receiving channel will be described later.

Moreover, in the antenna adjustment process of the embodiment, when the search range is within a range where the resonance frequency of the antenna 10 becomes high, the capacitance value of the tuning circuit 11 is to be switched by minimum switching steps by using all of the capacitative elements C0 to C8 in which connection can be switched as the first group of tuning condensers. On the other hand, when the search range is within a range where the resonance frequency of the antenna 10 becomes low, the capacitance value of the tuning circuit 11 is to be switched by the minimum switching steps taking two steps at a time by using the capacitative elements C1 to C8, omitting the minimum capacitative element C0, as the second group of tuning condensers.

As shown in FIG. 3, in the structure of the tuning circuit 11 and the antenna 10 of the embodiment, the amount of change in the resonance frequency of the antenna 10 corresponding to the constant switching step of the tuning circuit 11 becomes large in a range where the resonance frequency of the antenna 10 is high. On the other hand, the amount of change in the resonance frequency of the antennal 10 corresponding to the constant switching step of the tuning circuit 11 becomes small in a range where the resonance frequency of the antenna 10 is low. Therefore, by making the switching step of the tuning capacitance be minimum or by taking two steps at a time according to the search range as described above, excessively fine switching of the tuning capacitance can be omitted to shorten the process time needed for the search process.

Figure 5:
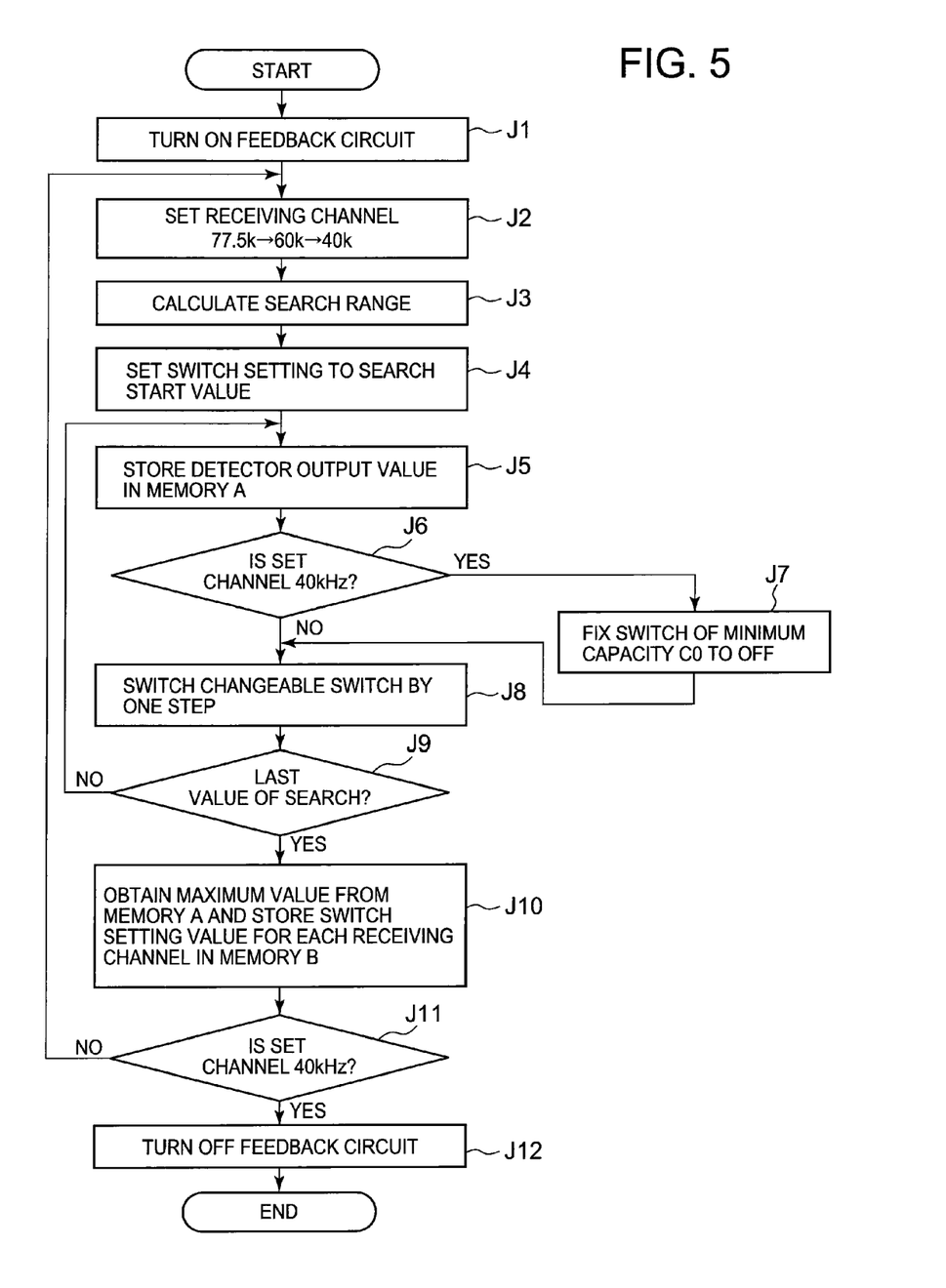
FIG. 5 is a flowchart showing a controlling procedure of the antenna adjustment process which is executed by a CPU of a control circuit.

In FIG. 5, a flowchart of the antenna adjustment process which is executed by the CPU of the control circuit 20 is shown. Hereinafter, the above antenna adjustment process will be described in detail by using the flowchart.

For example, the antenna adjustment process is executed based on a command which is inputted from outside in a setting adjustment process before being shipped out from a factory. Alternatively, the antenna adjustment process may be executed when a command to execute the adjustment process is given from outside via an operation unit (omitted from the drawing), for example, after the product shipment or may be executed when a normal receiving process cannot be carried out continuously because the receiving level is reduced during the radio wave receiving process.

When the antenna adjustment process is started, first, the CPU turns on the feedback circuit 16 (step J1). Hereby, an oscillation signal of frequency which is approximately equal to the resonance frequency of the antenna 10 is generated at the antenna 10 and at the circuit section of the tuning circuit 11.

Next, the CPU switches the characteristic of the filter 13 to set a receiving channel (step J2). In the embodiment, for example, the characteristic of the filter 13 is switched in the order of 77.5 kHz→>60 kHz→40 kHz.

When the receiving channel is set, next, the CPU calculates the search range corresponding to the receiving channel by formula (I) (step J3: search range deciding unit, calculation unit).

Formula 1

$$\frac{1}{(2\pi \times 1.1 \times f_0)^2 L} \leq C \leq \frac{1}{(2\pi \times 0.9 \times f_0)^2 L} \quad (1)$$

Here, C represents the search range which is converted to the capacitance value of the tuning circuit 11, $f_0$ represents the frequency of the desired wave of the receiving channel, L represents the inductance of the antenna 10, the coefficient "1.1" in left side and the coefficient "0.9" in right side are error coefficients which are decided from the acceptable error of the capacitative elements C0 to C9 and the inductance of the antenna 10. Here, the acceptance error of the capacitative elements C0 to C9 and the inductance of the antenna 10 is set to 5%, and the above error coefficient is decided so that the setting value for tuning the resonance frequency of the antenna 10 to the frequency of the desired wave is surely included in the search range even when the error of 5% occurs. When the acceptable error of each unit is different, the value of the above error coefficient can be arbitrarily changed according to the acceptable error.

Figure 6:
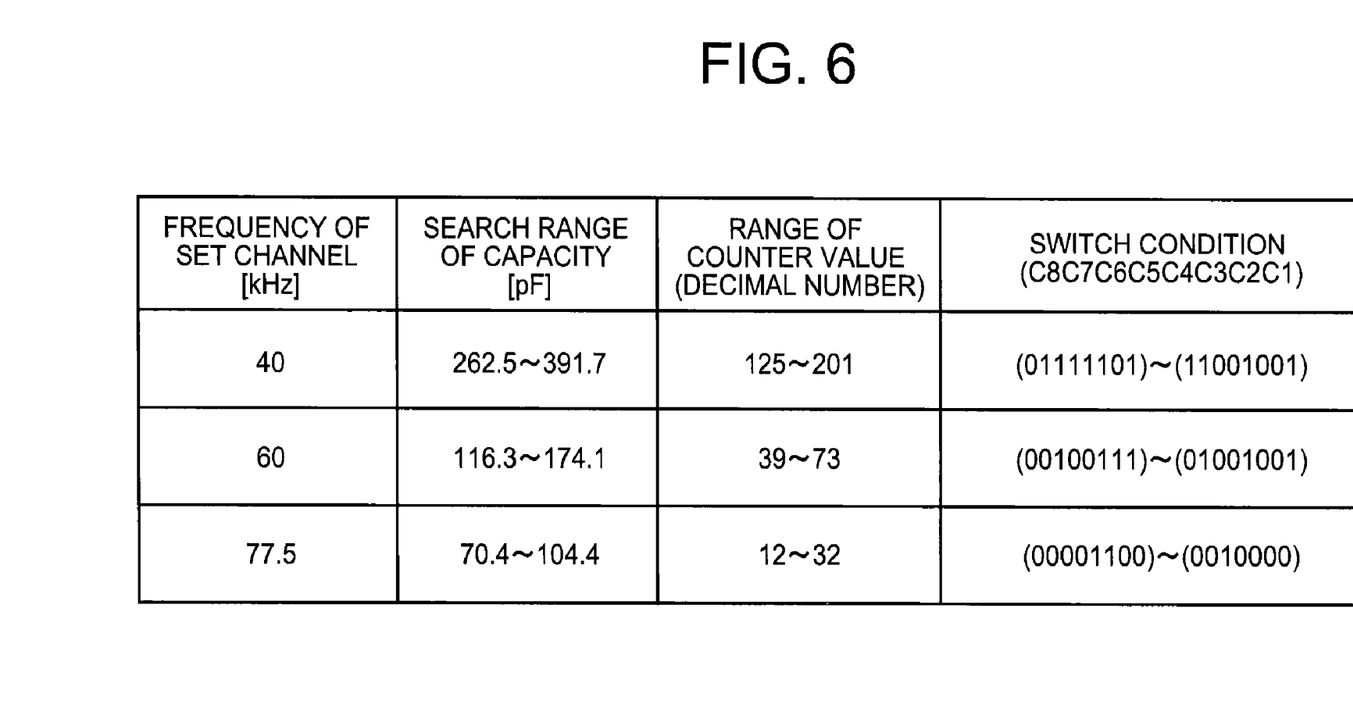
FIG. 6 is a table showing an example of search ranges corresponding to each of the receiving channels.

In FIG. 6, a table showing an example of the search ranges corresponding to each of the receiving channels is shown. In FIG. 6, the value of the least significant bit of the 9-bit counter corresponding to the minimum capacitative element C0 is omitted as being a value of after the decimal point.

By the above calculation process of step J3, for example, when the receiving channel is 40 kHz, the calculation is carried out by setting the search range which is converted to the capacitance value of the tuning circuit 11 to "262.5 pF to 391.7 pF" as shown in the second row in FIG. 6, and the counter value of the 9-bit counter corresponding to the search range of "262.5 pF to 391.7 pF" is "125 to 201" in decimal notation and is "01111101 to 11001001" in binary notation (value of the least significant bit corresponding to the minimum capacitative element C0 is omitted). Alternatively, a case when the receiving channel is 60 kHz and a case when the receiving channel is 77.5 kHz are shown in the third row and in the fourth row of the table of FIG. 6, respectively.

When the search range is calculated, next, the CPU sets the value of the 9-bit counter which decides ON/OFF condition of the switches S0 to S8 to the start value of the search range which is calculated in step J3 (step J4). For example, when the receiving channel is 77.5 kHz, the CPU sets the value of the 9-bit counter to the start value "12" shown in the line of "counter value range" in the fourth row of FIG. 6. Hereby, the total capacitance value which is to be in the connected condition in the tuning circuit 11 by the switches S0 to S8 being switched is set to the initial value of the search range (converted to the capacitance value).

Next, the CPU carries out AD conversion to the detector output level and stores the value in the memory area A in the RAM (step J5).

Next, the CPU determines whether the receiving channel which is currently set is 40 kHz or not (step J6), and moves to step J8 when the receiving channel which is currently set is not 40 kHz. However, when the receiving channel which is currently set is 40 kHz, the CPU carries out a setting of the switch S0 corresponding to the minimum capacitative element C0 so as to be fixed to OFF (step J7) and moves to step J8.

In step J8, the CPU switches the switches among the switches S8 to S0 which are set so as to vary by one step. That is, when the switch S0 corresponding to the minimum capacity is set so as to be fixed to OFF, value of the 9-bit counter is updated by adding "1" to the low-order second bit (or by adding "1" two times to the low-order 1 bit) of the 9-bit counter which decides ON/OFF condition of the switches S8 to S0. On the other hand, when the switch S0 corresponding to the minimum capacity is not set so as to be fixed to OFF, value of the 9-bit counter is updated by adding "1" to the low-order 1 bit of the 9-bit counter.

When the receiving channel is 60 kHz or 77.5 kHz, by updating the counter value in the above step J8, connection of the first group of tuning condensers (C8 to C0) including the minimum capacitative element C0 are switched and the total value of the tuning capacitance which is connected to the antenna 10 is to be switched by minimum switching steps.

On the other hand, when the receiving channel is 40 kHz, by updating the counter value in the above step J8, connection of the second group of tuning condensers (C8 to C1) excluding the minimum capacitative element C0 are switched and the total of the capacitance value which is connected to the antenna 10 is to be switched in order. That is, the total capacitance value is to be switched by minimum switching steps taking two steps at a time.

Figure 7:
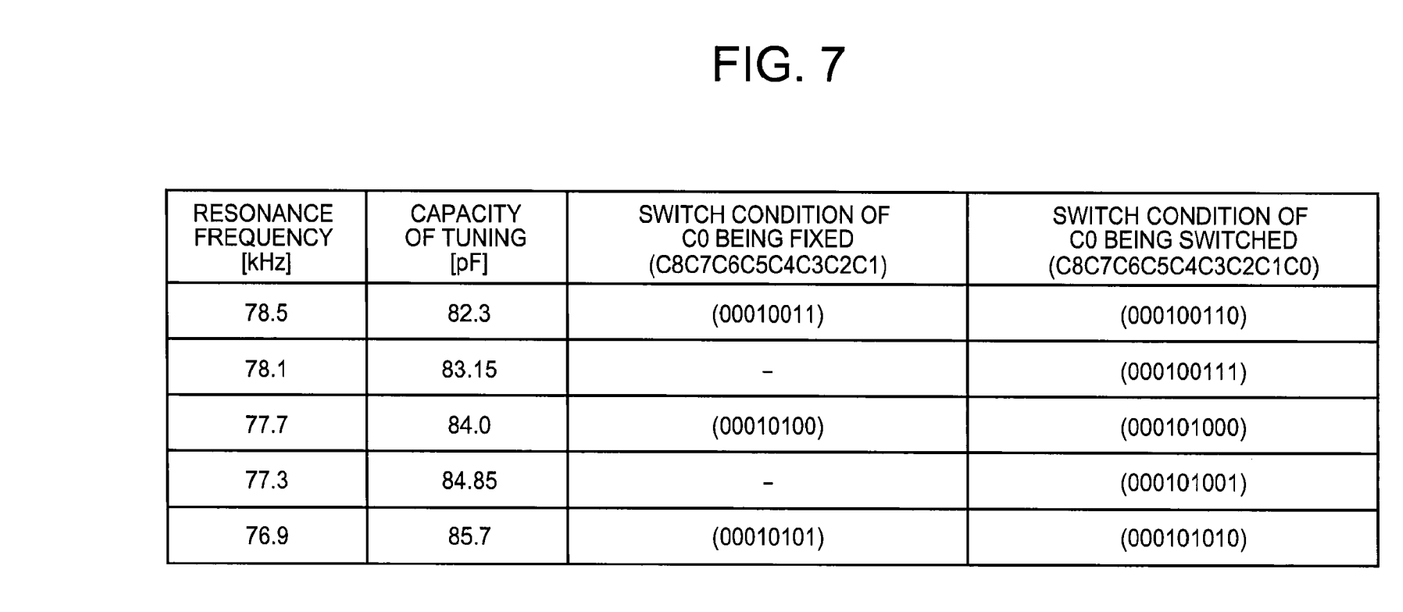
FIG. 7 is a table which explains difference between a case where connection of the minimum capacitative element C0 is switched and a case where connection of the minimum capacitative element C0 is not switched in the antenna adjustment process.

In FIG. 7, a table which explains a difference between a case where the connection of minimum capacitative element C0 is switched and a case where the connection of minimum capacitative element C0 is not switched in the antenna adjustment process is shown.

As shown in the table of FIG. 7, in a case where the resonance frequency of the antenna 10 is within a range of high frequency around 77.5 kHz, the total value of the tuning capacitance is switched by interval of 1.7 pF when the minimum capacitance element C0 is set so as to be fixed to OFF. Thereby, the resonance frequency of the antenna 10 is to be switched by an interval (for example, 800 Hz) which is too large (switching of the odd-number rows in the table of FIG. 7). Therefore, as described above, when the resonance frequency of the antenna 10 is within a range of high frequency, the resonance frequency of the antenna 10 can be switched by an adequate interval (for example, 400 Hz) by switching the capacitance value of the tuning circuit 11 by minimum switching steps, including the minimum capacitative element C0 (switching of the second to the sixth row in the table of FIG. 7).

When the capacitance value is switched by updating the counter value, next, whether the counter value has reached the last value within the search range or not is determined (step J9). When the counter value has not reached the last value within the search range, the process returns to step J5 and steps J5 to J8 are repeated. On the other hand, when the counter value has reached the last value within the search range, the process exits the loop process of steps J5 to J9 and moves to next which is step J10.

By step J4 and the loop process of steps J5 to J9, the setting of the tuning circuit 11 is switched within the search range which is calculated for each of the receiving channels, and also, AD conversion is carried out to the detector output level every time the setting is switched and the converted values are stored in the memory range A.

When each detector output level within the search range is stored and when the process is moved to step J10, the CPU compares the stored detector output levels and obtains the counter value (switch setting value to decide the condition of switches S0 to S8) of when the maximum detector output level was detected and stores this counter value in the memory region B of a RAM or a non-volatile memory by making this value so as to correspond to the current receiving channel. The counter value obtained here becomes the setting value of the tuning circuit 11 by which the resonance frequency of the antenna 10 is tuned to the frequency of the receiving channel.

Next, the CPU determines whether the current receiving channel is the last channel (40 kHz) or not. When the current receiving channel is not yet the last receiving channel, the process returns to step J2 and steps J2 to J10 are repeated. By repeating these steps, the setting value of the tuning circuit 11 by which the resonance frequency of the antenna 10 is made to tune to the frequency of the receiving channel can be obtained for all to the plurality of receiving channels (77.5 kHz, 60 kHz, 40 kHz).

Then, when the process is finished for all of the receiving channels, the process proceeds to YES in step J11 to turn off the feedback circuit 16 (step J12). Hereby, the oscillation signal at the antenna 10 and at the circuit section of the tuning circuit 11 stops. Then, the antenna adjustment process ends.

[Radio Wave Receiving Process]

The radio wave receiving process is started in a state where each of the optimum setting values of the tuning circuit 11 corresponding to the plurality of receiving channels are respectively stored in the memory region B by the antenna adjustment process. In the radio wave receiving process, the feedback circuit 16 will not be in operation state. When the radio wave receiving process is started, the CPU identifies a receiving channel of the standard radio wave based on control information of different system and switches the setting of the filter 13 so as to suit the receiving channel. Further, the optimum setting value of the tuning circuit 11 corresponding to the current receiving channel is read out among data stored in the memory region B by the antenna adjustment process and this value is set to the 9-bit counter which decides the connection condition of the switches S0 to S8. Then, the switches S0 to S8 are switched and the resonance frequency of the antenna 10 is tuned to the frequency of the current receiving channel.

Further, by starting the receiving operation in the above condition, the standard radio wave is received by the antenna 10 by high receiver sensitivity, and the received signal passes through the RF circuit 12, the filter 13 and the amplifier 14 to be detected at the detector circuit 15. Then, the detected time code signal is outputted and, for example, is read by the control circuit 20.

As described above, according to the radio wave receiver 1 of the embodiment, at the time of the antenna adjustment process, the search range in which the setting of the tuning circuit 11 is to be switched is narrowed down to a portion of the entire adjustable range according to the frequency of the desired wave. Therefore, the search process (process to switch the setting of the tuning circuit 11 while monitoring the detector output level) of the unneeded portion of the adjustable range where optimum setting condition of the tuning circuit 11 cannot be found can be omitted. Thereby, process time of the antenna adjustment process can be shortened greatly.

Moreover, according to the radio wave receiver 1 of the embodiment, because the search process in the unneeded portion of the adjustable range where optimum setting condition of the tuning circuit 11 cannot be found is omitted, as shown in FIG. 4, an advantage in which inconvenience of erroneously obtaining the optimum setting condition of the tuning circuit 11 due to noise N can be avoided even when a great noise source exists in the frequency outside of the search range, for example.

Further, according to the radio wave receiver 1 of the embodiment, the tuning circuit 11 has a broad adjustable range in which the antenna 10 can be tuned to all of the frequencies of a plurality of receiving channels. On the other hand, at the time of antenna adjustment process, the search process of each receiving channel is carried out only within the search range corresponding to each receiving channel. Therefore, process time of the antenna adjustment process can be remarkably shortened comparing to the case where the search process is repeatedly carried out within the entire adjustable range in the setting of a plurality of receiving channels.

Furthermore, even when the circuit constant of the antenna 10 and the tuning circuit 11 is deviated by the maximum acceptance error, the above described search range is calculated so as to include the adjustment point where the resonance frequency of the antenna 10 is made to tune to the frequency of the desired wave. Therefore, the optimum setting condition of the tuning circuit 11 can be obtained surely.

Moreover, according to the antenna adjustment process of the embodiment, because the search range is calculated and obtained from the frequency of the desired wave by the CPU carrying out the arithmetic processing, a memory region for storing information indicating the search range in advance is not needed, and even when there is a change in the frequency of the received channel or the acceptance error of the circuit elements, the process can easily react to the change by merely changing the variable value of the arithmetic expression.

Figure 8:
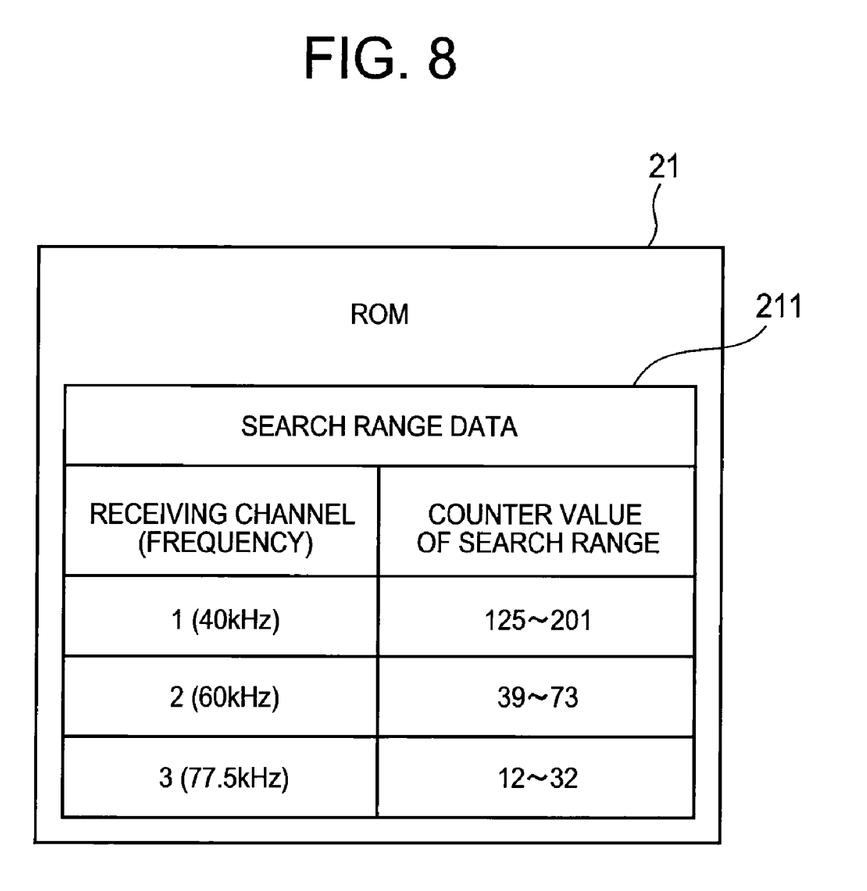
FIG. 8 is a diagram showing an example of data stored in a ROM in a radio wave receiver of other embodiment.

In FIG. 8, a diagram showing an example of data stored in ROM 21 in a radio wave receiver of other embodiment is shown. Here, in the above embodiment, the search range is obtained by the arithmetic processing. However, as shown in FIG. 8, the search range data (information of specific adjustable range) 211 in which data indicating the search range is registered so as to correspond to each receiving channel may be stored in the ROM (storage unit) 21 in advance, and the data of the search range may be read and decided from the search range data 211 at the time of deciding the search range. According to such structure, the structure needed for carrying out the arithmetic processing to obtain the search range is not needed. Further, it is advantageous because power consumption due to the arithmetic processing can be reduced when the antenna adjustment process is carried out when the apparatus is driven by a battery.

Further, according to the radio wave receiver 1 of the above embodiment, the capacitance value of the tuning circuit 11 is to be switched by minimum switching steps at the time of search process of the receiving channels of 77.5 kHz and 60 kHz. In contrary, at the time of search process of the receiving channel of 40 kHz, the capacitance value of the tuning circuit 11 is to be switched by minimum switching steps taking two steps at a time by setting the minimum capacitative element C0 so as to be fixed to OFF. Therefore, the resonance frequency of the antenna 10 can be changed by an adequate interval even when the resonance frequency of the antenna 10 is within a high range or when the resonance frequency of the antenna 10 is within a low range. Thereby, process time of the antenna adjustment process can be shortened comparing to the case where the search process is carried out by needlessly switching the resonance frequency of the antenna 10 by a fine interval.

Furthermore, the search process is carried out by switching the first group of tuning condensers formed of all of the capacitative elements C0 to C8 in which the connections can be switched within the search range corresponding to the receiving channels of 77.5 kHz and 60 kHz. On the other hand, the search process is carried out by switching the second group of tuning condensers formed of capacitative elements in which the minimum capacitative element C0 is excluded from the plurality of the capacitative elements C0 to C8, in which the connections can be switched within the search range corresponding to the receiving channel of 40 kHz. Therefore, switching of the capacitance value of the tuning circuit 11 suited to the search range can be realized without overly complicating the switching pattern of the setting of the tuning circuit 11.

Here, the present invention in not limited to the above embodiment, and various modifications can be carried out. For example, in the above embodiment, the CPU determines whether the resonance frequency of the antenna 10 approximated the frequency of the desired wave or not by monitoring the output level of the detector circuit 15. However, for example, the above determination may be carried out by directly monitoring the level of the signal which passes through the filter 13. Further, when automatic gain control of the RF circuit 12 and the amplifier 14 is carried out in order to stabilize the output of the detector circuit 15, the determination of whether the resonance frequency of the antenna 10 approximated the frequency of the desired wave or not and whether the oscillation signal passed through the filter 13 or not may by carried out by monitoring the automatic gain control.

Further, in the above embodiment, it is described that an adjustable range of the tuning circuit 11 in which the resonance frequency of the antenna 10 can be tuned to the frequency of the desired wave even when the inductance of the antenna 10 and the capacitative elements of the tuning circuit 11 have error which is the maximum acceptance error is applied as the search range. However, the search range may be set so that the search range will be minimum range within a range where the above condition can be fulfilled or the search range may be set so as to be slightly broader to allow leeway.

Furthermore, in the above embodiment, the search process is carried out for the entire search range. However, when the peak of the detector output level is detected during the search process, the search process can be stopped at this stage and the setting condition of the tuning circuit 11 when the peak of the detector output level was detected may be applied as the optimum setting condition. Further, in the above embodiment, all of the AD converted values of the detector output levels are stored to obtain the setting value of the tuning circuit 11 in which the maximum detector output level was obtained by comparing the stored values. However, by carrying out a comparing process every time when a new AD conversion value is obtained by comparing the new AD conversion value to the stored AD conversion value and by saving the AD conversion value which is larger in a memory region, the setting value of the tuning circuit 11 in which the detector output level is at the peak within the search region may be obtained.

Moreover, in the above embodiment, an example where only two types of changing is carried out in the switching of the tuning circuit 11, one type being switching by minimum switching steps and another type being switching by minimum switching steps taking two steps at a time, is shown. However, patterns of taking multiple steps at a time such as switching by minimum switching steps taking three steps at a time or taking four steps at a time may be added. Further, changing patterns of taking multiple steps at a time such as alternatively carrying out taking two steps at a time and taking three steps as a time and the like may be added.

Moreover, in the above embodiment, the number of steps to be taken at a time in the switching of the tuning circuit 11 is changed for each of the receiving channels. However, when the search process is carried out by switching the setting of the tuning circuit 11 for a broad search range with respect to one receiving channel, the number of switching steps to be taken at a time and the patterns may be changed for parts of the search range.

Moreover, in the above embodiment, an example where the present invention is applied to a receiving circuit of straight format is shown. However, the present invention can be similarly applied to receiving circuits of super heterodyne format and direct conversion format. Further, the details shown in the above embodiment such as the number and types of receiving channels, the number of capacitative elements of the tuning circuit, ratio of each capacitance value of the tuning circuit and the like can be arbitrarily changed within the scope of the present invention.

The entire disclosure of Japanese Patent Application No. 2009-133686 filed on Jun. 3, 2009 including descriptions, claims, drawings, and abstracts are incorporated herein by reference in its entirety.

What is claimed is:

1. A radio wave receiver, comprising:
an antenna to receive a radio wave;
a tuning unit to switch a frequency characteristic of the antenna in a stepwise fashion;
a positive feedback unit to oscillate the antenna and a circuit section of the tuning unit by applying a positive feedback to a signal path including the tuning unit;
a switching unit to turn a feedback operation of the positive feedback unit on or off;
a receiving process unit to carry out a signal process by extracting a signal of a desired wave among received signals which are received from the antenna, in a state in which the feedback operation of the positive feedback unit is turned off;

a search control unit for causing the positive feedback unit to generate an oscillation signal at the circuit section and searching for a setting condition of the tuning unit in which the oscillation signal is extracted in the receiving process unit while switching a setting of the tuning unit, in a state in which the feedback operation of the positive feedback unit is turned on; and a search range deciding unit to selectively decide an adjustable range in which the switching of the setting of the tuning unit is carried out by the search control unit so as to be a specific adjustable range which is a portion of an entire adjustable range of the tuning unit corresponding to a frequency of the desired wave according to the following formula (1):

$$\frac{1}{(2\pi \times 1.1 \times f_0)^2 L} \leq C \leq \frac{1}{(2\pi \times 0.9 \times f_0)^2 L} \quad (1)$$

wherein:
C is the specific adjustable range, which is converted to a capacitance value of the tuning unit;
$f_o$ is the frequency of the desired wave of a receiving channel;
L is an inductance of the antenna; and
coefficients 1.1 and 0.9 are error coefficients which are decided from acceptable errors of a capacitative element and the inductance of the antenna.

2. The radio wave receiver according to claim 1, wherein the receiving process unit is structured so as to carry out the signal process to each signal of the desired wave of a plurality of receiving channels by switching the receiving channels, and the search range deciding unit decides the specific adjustable range so as to correspond to each frequency of the desired wave of the plurality of receiving channels.

3. The radio wave receiver according to claim 2, wherein the search range deciding unit comprises a computing unit to calculate the specific adjustable range for tuning the frequency characteristic of the antenna to the frequency of the desired wave, and the search range deciding unit decides the specific adjustable range corresponding to each of the plurality of receiving channels based on a calculation result of the computing part.

4. The radio wave receiver according to claim 2, wherein the search range deciding unit comprises a storage unit in which information of the specific adjustable range corresponding to each of the plurality of receiving channels is stored, and the search range deciding unit selects the specific adjustable range corresponding to each of the plurality of receiving channels from the information in the storage unit.

5. The radio wave receiver according to claim 1, wherein the search range deciding unit decides a range including an amount of variance of the setting condition of the tuning unit based on an acceptable error of a circuit constant from the setting condition of the tuning unit where a resonance frequency of the antenna is most approximated to the frequency of the desired wave when the antenna and the tuning unit have an ideal circuit constant as the specific adjustable range corresponding to the frequency of the desired wave.

6. The radio wave receiver according to claim 1, wherein the tuning unit comprises a plurality of tuning condensers which connect with a signal line of the antenna and a plurality of switches to switch connection conditions of the plurality of tuning condensers, and the tuning unit is structured so that the frequency characteristic of the antenna is changed in the stepwise fashion by switching the plurality of switches.

* * * * *